United States Patent [19]
Urushima

[11] Patent Number: 6,046,495
[45] Date of Patent: Apr. 4, 2000

[54] SEMICONDUCTOR DEVICE HAVING A TAB TAPE AND A GROUND LAYER

[75] Inventor: Michitaka Urushima, Tokyo, Japan

[73] Assignee: NEC Corporation, Japan

[21] Appl. No.: 08/921,145

[22] Filed: Aug. 29, 1997

[30] Foreign Application Priority Data

Aug. 29, 1996 [JP] Japan .................................. 8-228917

[51] Int. Cl.[7] .............................................. H01L 23/495
[52] U.S. Cl. ........................... 257/668; 257/778; 257/780
[58] Field of Search .................................. 257/668, 780, 257/778

[56] References Cited

U.S. PATENT DOCUMENTS 5,376,588  12/1994  Pendse ..................................... 437/211
5,397,921   3/1995  Karnezos ................................. 257/779
5,640,047   6/1997  Nakashima .............................. 257/738

FOREIGN PATENT DOCUMENTS 8-30869   2/1996   Japan .
8-51128   2/1996   Japan .
8-97254   4/1996   Japan .

Primary Examiner—Teresa M. Arroyo

[57] ABSTRACT

A TAB tape is provided which has a ground layer which is connected to a ground wire within a device hole in a base film. A resin sealing hole for the purpose of holding in place a semiconductor chip and the base film is provided in the center of the ground layer, and a package in which a ground wire 8 is connected to a ground pad electrode is sealed with resin. Then, after forming bumps for heat radiating and grounding in the openings in the covering resist over the ground layer, the package is cut away, and is laid onto and joined to a printed circuit board, thereby forming shortened ground wiring within the semiconductor chip, not only reducing the inductance thereof, but also improving its radiation of heat.

16 Claims, 4 Drawing Sheets

SEMICONDUCTOR DEVICE HAVING A TAB TAPE AND A GROUND LAYER

BACKGROUND OF THE INVENTION

1. Field of the Invention

The present invention relates to a semiconductor device and manufacturing method therefor, and more specifically to a semiconductor device that is mounted to a board by means of a TAB tape with bump and a manufacturing method therefor.

2. Description of Related Art

In the past, such a semiconductor device was disclosed in Japanese Unexamined Patent Publication (KOKAI) No. 8-30869 as proposed by the inventor of the present invention. This semiconductor device, as shown in FIG. 3, is manufactured by mounting a semiconductor chip 2 onto an insulating base film 4 made of polyimide or the like.

More specifically, on both sides of the base film 4 in the latitudinal direction sprocket holes 15 are provided for the purpose of transporting and positioning the base film 4, these sprocket holes 15 being usable to move the base film 4 in its longitudinal direction.

The base film 4 has an aperture for the positioning the semiconductor chip 2, this being a device hole 1 which is provided in the inside thereof, and cut holes 16 being formed around the outside of this device hole 1.

On the base film 4 between the device hole 1 and the cut holes 16, are formed lands 17, which are electrically connected to the semiconductor chip 2 by inner leads 18. On the lands 17 ball-shaped bumps 10 are formed of solder or the like, to form material for forming external connection electrodes.

As shown by the broken line in FIG. 3, the partitioned area other than at the bumps 10 is covered by a cover resist 9, this cover resist 9 preventing the contamination of the inner leads 18, for example.

The semiconductor chip 2 and the inner leads 18 around the periphery thereof are sealed with a resin.

Finally, by cutting the base film 4 away from the cut holes 16, a semiconductor device formed by the semiconductor chip 2 and the base film 4 is obtained.

In a semiconductor device having the above-noted configuration, because it is possible to mount the bumps 10 on top of the lands 17 directly to a printed circuit board 20, the base film material can be substantially used as a package material.

Therefore, compared to a semiconductor device having a package of ceramic or the like, this device offers the advantage of low cost. Also, because the wiring region of the inner leads 18 is limited to an area formed inside of the cut holes 16, it offers an advantage in compactness as well.

Another example from the past is shown in FIG. 4, in which there is an improvement in heat dissipation. In this device, a wire which is flush with the same plane as the inner leads 18 within the device hole 1 suspends a suspended land 22, onto which is formed a heat-radiating bump 25, which radiates heat to the printed circuit board 20, a heat-radiating plate 24 and heat sink 21 being mounted to improve the heat dissipation.

In a semiconductor device as described above, because the inner leads 18 and the solder bumps 10 are disposed on one and the same plane, a terminal disposed outside of the package, for example, would have a long wiring length, resulting in a deterioration of electrical characteristics with regard to inductance (L) and the like.

With increases in speed, there are particular problems with faulty operation if ground leads are not made short to reduce the influence of noise. Thus, it is necessary to make the wiring length as short as possible, to improve its electrical characteristics.

To achieve this, a two-metal TAB tape, having metal layer on the reverse side of the base film is used, ground wires being connected by means of a through hole, thereby improving the quality of grounding to improve the electrical characteristics.

However, when this two-metal tape is used, the TAB tape cost rises, making practical use of this method difficult.

On the other hand, in the Japanese Unexamined Patent Publication (KOKAI) No. 8-51128, although a bumped array TAB package is disclosed, it simply shows a TAB tape comprising one conductive layer which is patterned so as to form wiring connected with each one of the pads arranged on the tape in an array configuration.

However, it fails to show or suggest a technical feature of making use of a conductive metal layer formed just below a semiconductor chip.

The Japanese Unexamined Patent Publication (KOKAI) No. 8-97254 shows a method for mounting a semiconductor on a printed board in that on a surface of an insulating resin film formed in an area surrounded by a plurality of device holes in the TAB tape, lead wires are formed.

However, it fails to show or suggest forming a metal film over all of the surface of the area to be used for a grounding wire.

As mentioned above, in accordance with these prior arts, signal wires and grounding wires should be formed on one surface of the TAB tape with relatively long lengths thereof and thus preventing minimizing the semiconductor device.

In view of the above-described drawbacks in the prior art, an object of the present invention is to provide a semiconductor device having an economic configuration, with a minimal wiring length to improve the electrical characteristics thereof, and a method of manufacturing this semiconductor device.

SUMMARY OF THE INVENTION

To attain the object of the present invention as mentioned above, the present invention is a semiconductor device which is constructed by using a TAB tape that consists of a carrier film tape having device holes forming an area surrounded by the device holes and to which a semiconductor chip is to be connected. Inner leads are joined to the electrodes of the semiconductor chip formed on one of surfaces of the TAB tape, and lands for external connections and formed on the same surface of the TAB tape as that to which the inner leads are provided. The semiconductor device including a first metal layer formed at least on the area surrounded by the device holes and on the same surface of the TAB tape on which inner leads are formed. The inner leads are mutually and electrically connected to pad electrodes of the semiconductor chip, while the first metal layer is connected to wiring portions of a mounting board through a suitable conductive material.

A second aspect of the present invention provides a method of manufacturing a semiconductor device in which the device is produced by using a TAB tape that consists of a carrier film tape having device holes forming an area surrounded by the device holes and to which a semiconductor chip is to be connected. Inner leads are joined to the electrodes of the semiconductor chip formed on one of the surfaces of the TAB tape. Lands for external connections are formed on the same surface of the TAB tape as that to which the inner leads are provided. The method includes the steps of: forming a first metal layer on at least the area surrounded by the device holes and on the same surface of the TAB tape on which the inner leads are formed; electrically connecting the inner leads to pad electrodes of the semiconductor chip; and electrically connecting the first metal layer to wiring portions of a mounting board through a suitable conductive material.

DETAILED DESCRIPTION OF THE PREFERRED EMBODIMENTS

Figure 1A:
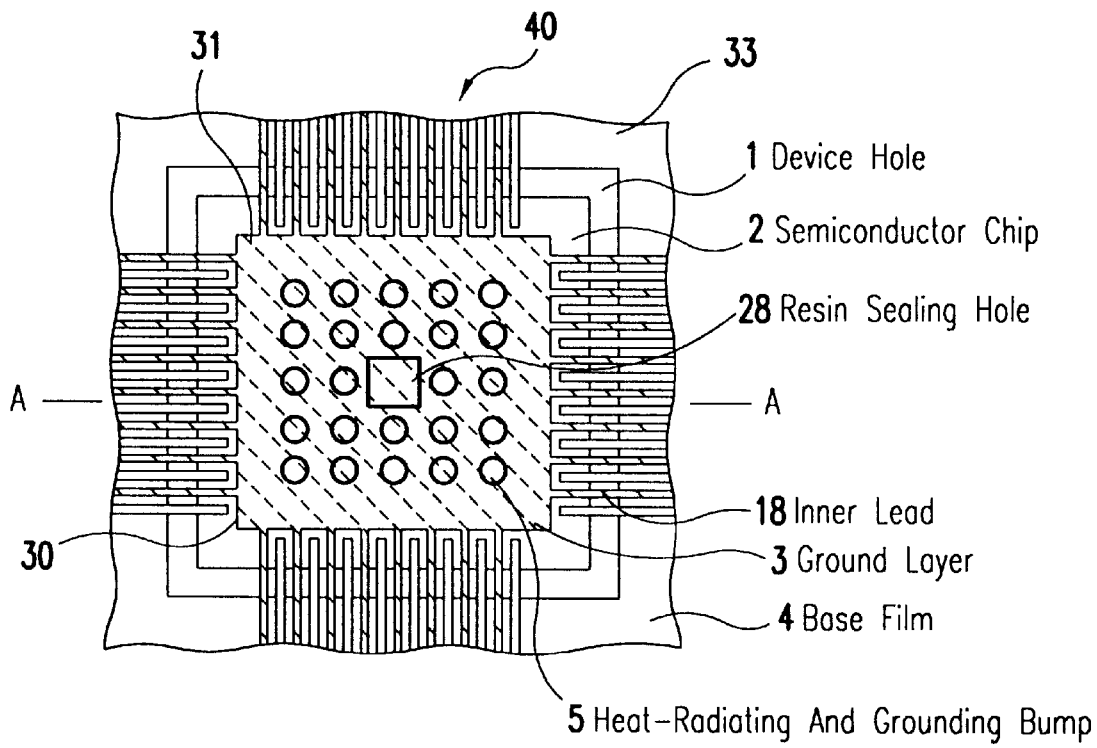
FIG. 1(A) is a plan view of the first embodiment of the present invention.
Figure 1B:
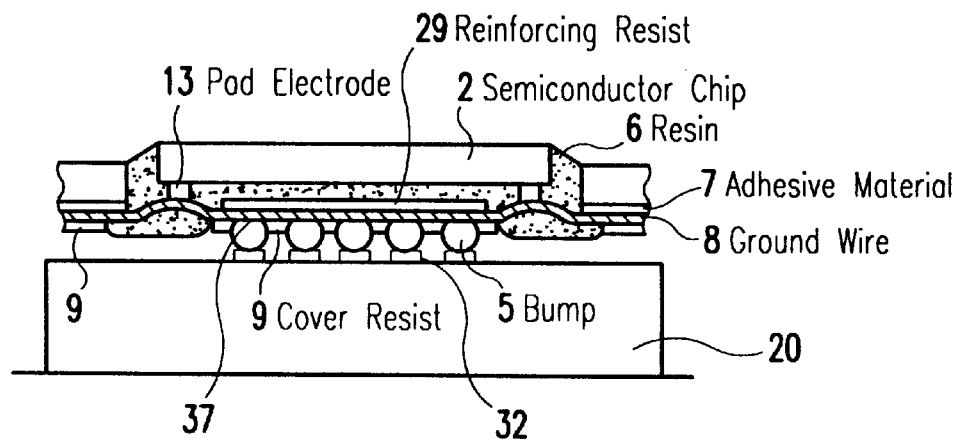
FIG. 1(B) is a cross-sectional view thereof taken along the cutting line A—A, as shown in FIG. 1(A).

The embodiments of the present invention will be described with reference to the attached drawings, as follows:

FIG. 1(A) presents a plan view of the first embodiment of a semiconductor device 40 according to the present invention, and FIG. 1(B) represents a cross-sectional view thereof, taken along the cutting line A—A, as shown in FIG. 1(A).

As is apparent from FIG. 1(A) and FIG. 1(B), the configuration of the semiconductor device of the present invention is shown in that a semiconductor device 40 is constructed by using a TAB tape 33 that consists of a carrier film tape having device holes 1 forming an area 30 surrounded by the device holes 1 and to which a semiconductor chip 2 is to be connected. Inner leads 18 formed on one surface of the TAB tape 33 are joined to the electrodes 13 of the semiconductor chip 2. Lands 17 (see FIGS. 2B and 2C) for external connections to inner leads 18 are formed on the same surface of the TAB tape 33 as that to which the inner leads 18 are provided. The semiconductor device 40 includes a first metal layer 31 formed at least in the area 30 surrounded by the device holes 1 and on the same surface of the TAB tape 33 on which inner leads 18 are formed. The first metal layer 31 is connected to wiring portions 32 of a mounting board 20 through a suitable conductive material 5. The first metal layer 31 is used as a ground layer, or alternatively, also for signal wiring, as explained more fully below.

The first embodiment of the present invention will be further explained more precisely with reference to FIGS. 1(A) and 1(B).

In the manufacturing process for this embodiment, first a TAB tape 33 is formed which has a ground layer 3 which connects to a ground wire inside the device hole 1 of the base film 4.

Then, the semiconductor chip 2 and the base film 4 are held fixed in the center part of the ground layer 3, and a resin sealing hole 28 is provided optionally for the purpose of coating the semiconductor chip 2 with a resin 6 that protects its surface.

However, there are cases in which, if the semiconductor chip 2 is small, for example on the order of 5 millimeters square, if resin is injected into the aperture part of the inner leads 18 within the device hole, capillary action can enable the resin 6 to flow between the ground layer 3 and the semiconductor chip 2, thereby enabling the elimination of the sealing hole 28.

Next, the ground wire 8 is connected to the pad electrode 13 used for grounding, and sealing by the resin 6 is performed.

By virtue of this configuration, because the ground wire is included within the semiconductor chip 2, it is possible to make the length thereof short, thereby enabling a reduction in the lead inductance.

When this resin 6 cures, there might be some sag because the ground layer 3 is only a metal foil. In this case a resist 29 for the purpose of reinforcement can be formed on the bottom part of the metal foil.

If this resist 29 is the same as the resist that is formed on the top surface of the ground layer 3, it is possible to achieve a balance in thermal expansion.

Next, the bumps 5, for the purpose of heat radiation and grounding, are formed at the apertures of the cover resist 9, i.e., the lands 17, formed on the top of the ground layer 3.

When doing this, it is possible to simultaneously form the external bump 10 of the device hole 1. (See FIG. 2(B).

If the package is completed without forming the heat-radiation and grounding bumps 5 and mounted to a printed circuit board 20, it is possible to form an electrically conductive and heat-radiating adhesive resin between the ground layer 3 and the printed circuit board 20.

Specifically, adhesive resin is dispensed to the printed circuit board 20, after which the package is mounted and reflowing is done to effect a joining thereto.

If there is the above-described reinforcing resist 29, because the independent formation of a pattern features on the metal foil of the ground layer 3 which are joined to the inner leads 18 is facilitated, it is not necessary to wire all of the internal lands 17 of the ground layer 3 to ground.

That is, because it is possible to independently wire the ground, power supply, and signal leads to the ground layer 3 inside the device hole 1 in the same manner as lands 17 outside the device hole 1, the degree of freedom is increased and optimization is possible.

A package formed in the above-described manner provides not only improved electrical characteristics, but also reduced manufacturing cost.

A feature of using this package for mounting onto a mounting board, is that it is possible to more effectively dissipate heat generated from the semiconductor chip 2 to the printed circuit board.

As explained above, in the present invention, the first metal layer 31 is preferably provided on an overall surface of the area 30 of the TAB tape 33 surrounded by the device holes 1.

Further in the present invention, the conductive material 5 is desirably selected from a bump-like conductive element and a paste-like conductive element, and while in the present invention, the first metal layer 31 is mainly used as a grounding electrode.

However, in the present invention, the first metal layer 31 may have a configuration, for example, in that grounding wiring portions and signal wiring portions are mixedly provided.

In this embodiment, specific wiring may be formed within the first metal layer 31 by etching operation or the like so as to separate the specific wiring from the grounding portion.

Under this embodiment, the signal wiring portions as provided in the first metal layer 31 are preferably connected to either one of the wiring portions provided on the semiconductor chip 2 or the wiring portions provided on the mounting board 20 through the bump-like conductive element 5.

Figure 2A:
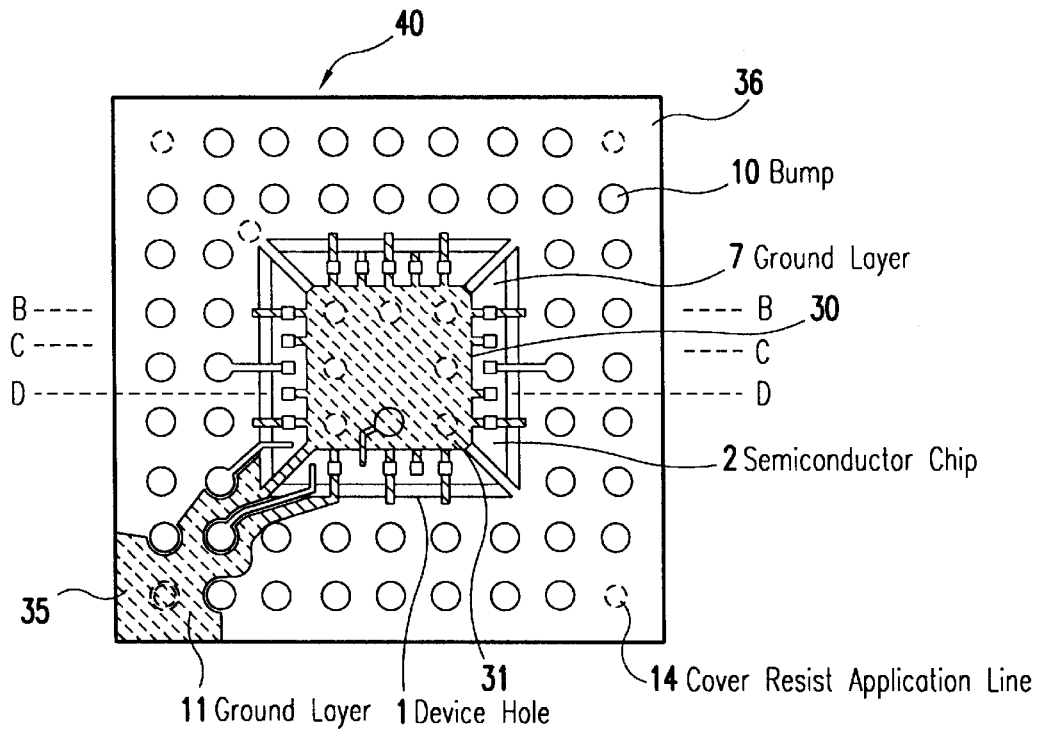
FIG. 2(A) is a plan view of the second embodiment of the present invention.
Figure 2B:
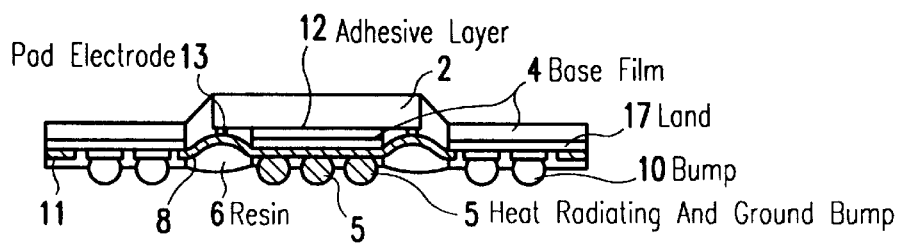
FIGS. 2(B), 2(C) and 2(D) are cross-sectional views thereof taken along the cutting lines B—B, C—C, and D—D, as shown in FIG. 2(A), respectively.
Figure 2C:
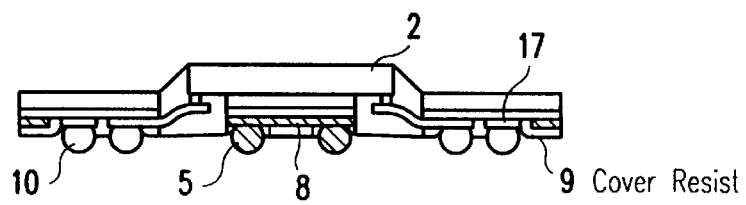
Figure 2D:
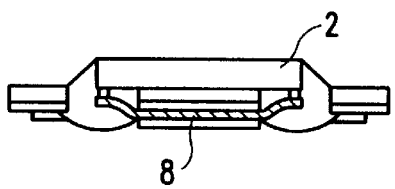
Figure 3A:
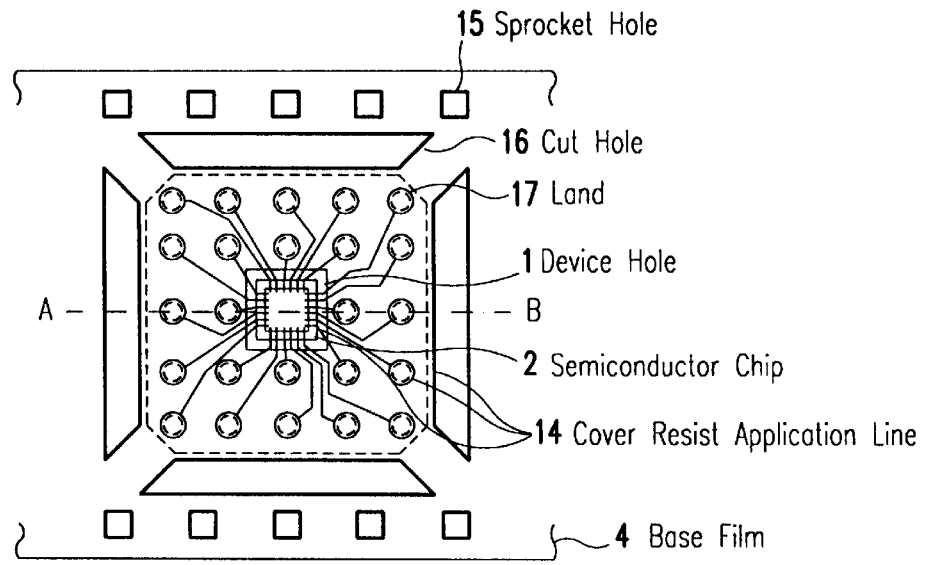
FIG. 3(A) is a plan view which illustrates a prior art semiconductor device.
Figure 3B:
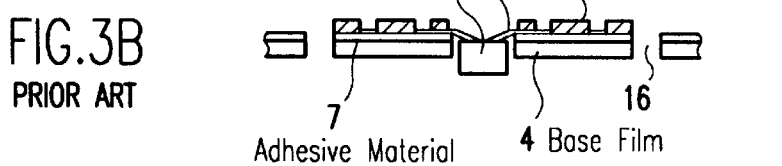
FIG. 3(B) is a cross-sectional view thereof taken along the cutting line A—A, as shown in FIG. 3(A).
Figure 3C:
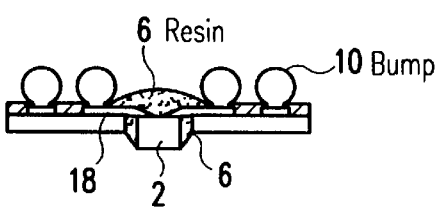
FIGS. 3(C) and 3(D) are, respectively, a cross-sectional view of the same portion as shown in FIG. 3(B) after sealed resin and bumps are applied thereto, and a cross-sectional view showing a configuration after the semiconductor chip supported by the TAB tape has been mounted on a printed board.
Figure 3D:
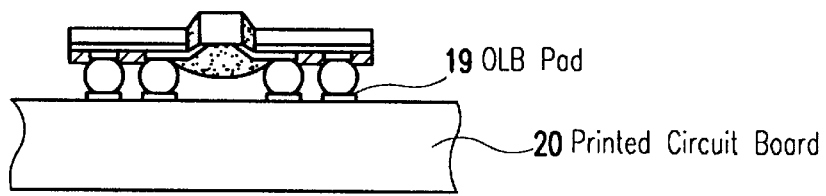
Figure 4A:
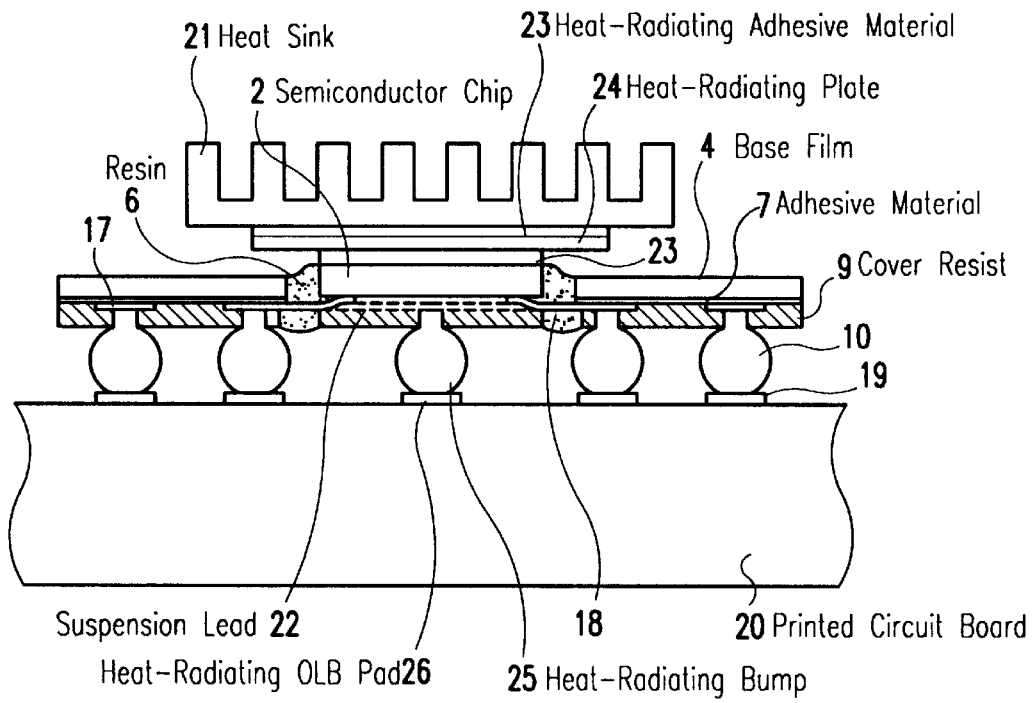
FIGS. 4(A) and 4(C) are, respectively, a cross-sectional view and a plan view of another example of a prior art semiconductor device.
Figure 4B:
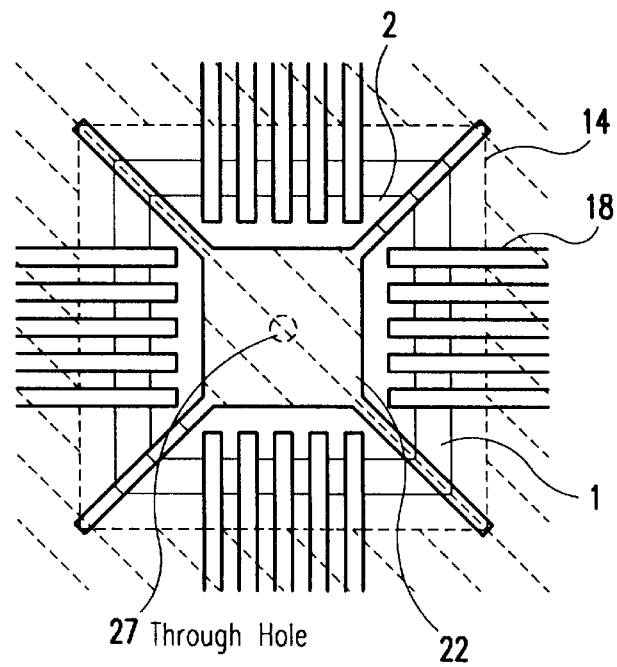

FIG. 2(A) shows a plan view of the second embodiment of the present invention, and FIGS. 2(B) to 2(D) are the cross-sectional views thereof, taken along the cutting lines B—B, C—C, and D—D, respectively.

As shown in FIGS. 2(A) to 2(D), the construction of this embodiment is such that a ground layer 11 is formed also around the periphery of the lands 17 on the outside of the device hole 1, this being connected to the ground layer 3 within the device hole 1.

The ground layer 11 outside the device hole 1 is constructed so as to pass through all the wires which extend to the inner leads 18.

By virtue of this construction, it is possible to significantly reduce the wiring inductance, and it was verified experimentally that this was reduced to less than half.

For example, in the case of a 40-mm-square package, whereas this was a maximum of 25 nH for the construction of the past, this was a maximum of 7 nH in the case of this embodiment of the present invention.

As shown in FIG. 2(B), it is possible to have a construction in which the base film 4 remains at the bottom of the ground layer 3 inside the device hole 1, the semiconductor chip 2 being adhered to the adhesive layer 12 provided thereunder, with only the inner leads 18 coated with the resin 6.

Using this construction, because there is no need to inject the resin 6 inside the ground layer 3, it is possible to achieve stable flatness.

In accordance with the second embodiment of the present invention, the semiconductor device 40 is characterized in that a second metal layer 35 may be additionally formed on one surface of the TAB tape 33 and on an area 36 other than the area 30 surrounded by the device holes 1, and the second metal layer 35 is also formed on the same surface of the tape on which the first metal layer 31 is provided, and wherein the first metal layer 31 and the second metal layer 35 are mutually and electrically connected to each other.

Further, in the second embodiment of the present invention, a plurality of land portions 17 may be provided in the area 36 in which the second metal layer 35 is formed.

As mentioned in the first embodiment of the present invention, in this embodiment, the second metal layer also has a configuration in that grounding wiring portions and signal wiring portions to be connected to the land portions are mixedly provided and more over, the second metal layer 35 is also used for grounding electrode, in this embodiment.

And in this embodiment, it is apparent that the signal wiring portions as provided in the second metal layer 35 are connected to either one of external wiring portions or the wiring portions provided on the mounting board through the bump-like conductive element.

As mentioned above, in the present invention, either in the first embodiment or the second embodiment, at least a part of a film base portion 4 of the carrier film tape 33 remains at least on a surface of the first metal layer opposite to the semiconductor chip with the film base portion being still connected to the first metal layer.

And in this case, the film base portion 4 of the carrier film tape 33 is preferably polyimide resin.

In this embodiment, the film base portion 4 of the carrier film tape 33 serves as a reinforcing resist.

Further, in the present invention, the film base portion 4 of the carrier film tape 33 is connected to the semiconductor chip 2 through a suitable adhesive material 5.

As described above, in accordance with the present invention, the following methods for manufacturing the semiconductor device are provided.

For example, as a first aspect, the method for manufacturing the semiconductor device in the present invention includes: a method of manufacturing a semiconductor device in which the device is produced by using a TAB tape that consists of a carrier film tape having device holes forming an area surrounded by the device holes and to which a semiconductor chip is to be connected, inner leads which are joined to the electrodes of the semiconductor chip formed on one of surfaces of the TAB tape, and lands for external connections and formed on the same surface of the TAB tape as that to which the inner leads are provided. The method comprises the steps of: forming a first metal layer on at least the area surrounded by the device holes and on the same surface of the TAB tape on which the inner leads are formed; electrically connecting the inner leads to pad electrodes of the semiconductor chip; and electrically connecting the first metal layer to wiring portions of a mounting board through a suitable conductive material.

As another aspect of the method therefor as provided in the present invention, in a method of manufacturing a semiconductor device as mentioned above, the following steps may be added thereto: forming a second metal layer on one surface of the TAB tape and on an area other than the area surrounded by the device holes, the surface of which is the same surface thereof on which the first metal layer being provided; and electrically and mutually connecting the first metal layer and the second metal layer to each other.

In another aspect of the method therefor in the present invention, a method of manufacturing a semiconductor device comprises the steps of: forming a TAB tape which has a ground wire connected to ground on an area surrounded by the device hole of a film carrier on which a semiconductor is to be rested; forming a resin sealing hole in the center of the ground wire; connecting a ground wire to a grounding pad electrode of the semiconductor chip; injecting resin into a space formed between the TAB tape and the semiconductor device through the resin sealing hole to seal the semiconductor chip; forming a bump in the hole part that is opened in covering resist of the ground wire; cutting the TAB tape to form a plurality of packages, each of which including at least one semiconductor chip therein; and mounting each the package on a mounting board, thereby forming the ground wire on the inside area of the semiconductor chip.

According to the present invention as described above, because it is possible to make the ground wires short, in addition to enabling an improvement in the electrical characteristics thereof, it is possible to manufacture the package at a lower cost than a package in the past. Additionally, because of the ability to dissipate heat to the printed circuit board, heat dissipation is greatly improved.

What is claimed is:

1. A semiconductor device constructed using a TAB tape comprising:
 a carrier film tape having two sides, a device hole formed through the film tape, and a surface on one of said sides;
 an area within said device hole for accepting a semiconductor chip;
 inner leads disposed on said surface of said tape and joined directly to electrodes of the semiconductor chip;
 lands for external connections disposed on said surface of said tape and
 a first metal layer formed in said area surrounded by said device hole and on said same side of said film tape as said surface on which said inner leads are disposed, said first metal layer being connected to wiring portions of a mounting board by a conductive material.

2. A semiconductor device according to claim 1, wherein said first metal layer is provided so as to cover an overall expanse of said area of said tape surrounded by said device hole.

3. A semiconductor device according to claim 1, wherein said conductive material is either a bump-like conductive element or a paste-like conductive element.

4. A semiconductor device according to claim 1, wherein said first metal layer is used as a grounding electrode.

5. A semiconductor device according to claim 1, wherein said first metal layer has a configuration in that grounding wiring portions and signal wiring portions are mixedly provided.

6. A semiconductor device according to claim 5, wherein said signal wiring portions as provided in said first metal layer are connected to either one of said wiring portions provided on said semiconductor chip or said wiring portions provided on said mounting board through s bump-like conductive elements.

7. A semiconductor device according to claim 1, wherein a second metal layer is formed on said surface of said tape and on an area other than said area surrounded by said device hole, wherein said first metal layer and said second metal layer are mutually electrically connected.

8. A semiconductor device according to claim 7, wherein a plurality of land portions are provided in said area in which said second metal layer is formed.

9. A semiconductor device according to claim 7, wherein said second metal layer has a configuration in that grounding wiring portions and signal wiring portions to be connected to said land portions are mixedly provided.

10. A semiconductor device according to claim 7, wherein said second metal layer is used as a grounding electrode.

11. A semiconductor device according to claim 7, wherein said signal wiring portions as provided in said second metal layer are connected to either external wiring portions or wiring portions provided on a mounting board through bump-like conductive elements.

12. A semiconductor device according to claim 1, wherein at least a part of a film base portion of said carrier film tape is provided at least on a surface of said first metal layer opposite to said semiconductor chip with said film base portion being connected to said first metal layer.

13. A semiconductor device according to claim 12, wherein said film base portion of said carrier film tape is polyimide resin.

14. A semiconductor device according to claim 12, wherein said film base portion of said carrier film tape serves as a reinforcing resist.

15. A semiconductor device according to claim 12, wherein said film base portion of said carrier film tape is connected to said semiconductor chip by a adhesive material.

16. A semiconductor device according to claim 1, wherein the first metal layer comprises a metal foil.

* * * * *